(12) United States Patent
Furui et al.

(10) Patent No.: US 9,269,741 B2
(45) Date of Patent: Feb. 23, 2016

(54) PRODUCTION METHOD OF RADIATION IMAGE DETECTOR AND RADIATION IMAGE DETECTOR

(75) Inventors: Koji Furui, Hachioji (JP); Yoko Hirai, Hachioji (JP)

(73) Assignee: KONICA MINOLTA MEDICAL & GRAPHIC, INC., Tokyo (JP)

( * ) Notice: Subject to any disclaimer, the term of this patent is extended or adjusted under 35 U.S.C. 154(b) by 0 days.

(21) Appl. No.: 13/819,123

(22) PCT Filed: Feb. 18, 2011

(86) PCT No.: PCT/JP2011/053470
§ 371 (c)(1),
(2), (4) Date: Feb. 26, 2013

(87) PCT Pub. No.: WO2012/032797
PCT Pub. Date: Mar. 15, 2012

(65) Prior Publication Data
US 2013/0154039 A1 Jun. 20, 2013

(30) Foreign Application Priority Data
Sep. 7, 2010 (JP) .................. 2010-199673

(51) Int. Cl.
*H01L 27/146* (2006.01)
*G01T 1/20* (2006.01)

(52) U.S. Cl.
CPC ........ *H01L 27/14663* (2013.01); *G01T 1/2018* (2013.01); *H01L 27/14685* (2013.01)

(58) Field of Classification Search
CPC .............. H01L 27/14663; H01L 27/14685; H01L 31/115; H01L 31/3529
USPC ........................................... 257/428; 438/65
See application file for complete search history.

(56) References Cited

U.S. PATENT DOCUMENTS

2006/0033032 A1* 2/2006 Inoue .................... G01T 1/2018
250/370.11
2008/0173824 A1* 7/2008 Sekiguchi ............ C09K 11/616
250/370.11
(Continued)

FOREIGN PATENT DOCUMENTS

JP 2001-042041 2/2001
JP 2002-341038 A 11/2002
(Continued)

OTHER PUBLICATIONS

Office Action dated Sep. 17, 2014 for corresponding Japanese Patent Application No. JP2012-532874 and English translation.
(Continued)

*Primary Examiner* — Matthew W Such
*Assistant Examiner* — Warren H Kilpatrick
(74) *Attorney, Agent, or Firm* — Lucas & Mercanti, LLP

(57) ABSTRACT

The present invention provides a production method of a radiation image detector, comprising a scintillator panel preparation step, a composite rigid plate preparation step of bonding a flexible polymer film to a rigid plate with an adhesive to prepare the composite rigid plate, a preparation step of a scintillator panel provided with a composite rigid plate of bonding the composite rigid plate to a scintillator panel to prepare the scintillator panel provided with a composite rigid plate, and a preparation step of a radiation image detection member of opposing the surface of the photoelectric conversion base plate in which the photoelectric conversion elements are disposed to the surface of the side of the scintillator layer of the scintillator panel provided with the composite rigid plate and bonding the photoelectric conversion base plate to the scintillator panel to prepare a radiation image detection member; whereby there are provided a production method of a radiation image detector which can be easily produced and results in superior image uniformity, and a radiation image detector obtained by the method.

9 Claims, 2 Drawing Sheets

(56) References Cited

U.S. PATENT DOCUMENTS

| | | | |
|---|---|---|---|
| 2010/0006762 A1* | 1/2010 | Yoshida | C09K 11/613 250/361 R |
| 2010/0072379 A1* | 3/2010 | Nishino | G01T 1/2018 250/363.08 |

FOREIGN PATENT DOCUMENTS

| | | |
|---|---|---|
| JP | 2003-075543 | 3/2003 |
| JP | 2007-285709 A | 11/2007 |
| JP | 2008-215951 A | 9/2008 |

OTHER PUBLICATIONS

Office Action dated Apr. 21, 2015 from the corresponding Japanese Patent Application No. 2012-532874.

English translation of the Office Action dated Apr. 21, 2015 from the corresponding Japanese Patent Application No. 2012-532874.

Office Action dated Nov. 30, 2015 from JP2012-532874 and English Translation thereof.

* cited by examiner

PRODUCTION METHOD OF RADIATION IMAGE DETECTOR AND RADIATION IMAGE DETECTOR

CROSS REFERENCE TO RELATED APPLICATION

This Application is a 371 of PCT/JP2011/053470 filed on Feb. 18, 2011 which claimed priority of Japanese Application No. JP2010-199673 filed Sep. 7, 2010, both applications are incorporated by reference herein.

TECHNICAL FIELD

The present invention relates to a radiation image detector for use in forming a radiation image of an object and a method for producing the radiation image detector.

TECHNICAL BACKGROUND

There have been broadly employed radiation images such as X-ray images for diagnosis of the conditions of patients in medical practice. Specifically, radiation images using an intensifying-screen/film system, which have achieved enhancement of speed and image quality, are still used on the scene of medical treatment as a conventional imaging system having high reliability and superior cost performance in combination.

However, these image data are so-called analog image data, in which free image processing or instantaneous image transfer cannot be realized.

Recently, there appeared digital system radiation image detection apparatuses, as typified by a computed radiography (also denoted simply as CR) and a flat panel radiation detector (also denoted simply as FPD).

Systems for use in a digital radiation image detector include a direct system and an indirect system.

There is known, for example, a radiation image detector using a solid-state imaging sensor (such as CCD or CMOS), as a direct system, which is used in non-destructive testing for industrial use or is inserted into a mouth to collect stationary pictures for use in dental radiography.

An indirect system uses a phosphor layer (scintillator layer) containing a phosphor, in which X-rays are initially converted to visible radiation and the visible radiation is converted to a signal charge through a photoelectric conversion substrate provided with photoelectric conversion elements such as a photodiode, CCD or CMOS and introduced to a capacitor for charge accumulation.

There is broadly used an indirect system which is simple and exhibits higher sensitivity, compared to a direct system.

There are also known radiation image detectors used in an indirect system, such as a radiation image detector of a system in which a phosphor layer is provided directly on a planar light-receiving element, and a radiation image detector of a system in which a phosphor layer provided on the substrate of a scintillator panel is bonded to photoelectric conversion elements which are two-dimensionally disposed on a photoelectric substrate.

In such a radiation image detector of a bonding system, uniformity of contact of a phosphor layer with photoelectric conversion elements greatly affects image quality.

Accordingly, to reduce bubbles produced between the phosphor layer and the photoelectric conversion elements, for example, there is known a production method, wherein a photoelectric conversion substrate is coated with a transparent adhesive and is pasted onto a scintillator panel under reduced pressure, and then, the transparent adhesive is hardened under atmospheric pressure (as described in, for example, Patent document 1).

However, a non-uniformed image is sometimes produced in such a radiation image detector obtained by the foregoing production method, so that there has been desired a radiation image detector in which occurrence of image unevenness is reduced.

PRIOR ART DOCUMENT

Patent Document

Patent document 1: JP 2007-285709 A

SUMMARY OF THE INVENTION

Problems to be Solved in the Invention

It is an object of the present invention to provide a production method of a radiation image detector which can be easily produced and results in superior image uniformity, and a radiation image detector obtained by the method.

Means for Solving the Problems

The foregoing problems can be solved by the following means of the present invention.

1. A production method of a radiation image detector comprising a scintillator panel which is provided with a scintillator layer on a substrate, a rigid plate which is disposed on a side of the substrate of the scintillator panel and a photoelectric conversion base plate which is disposed on a side of the scintillator layer of the scintillator panel and provided with plural photoelectric conversion elements on one side of a base board, the method comprising:

(1) a scintillator panel preparation step of forming a scintillator layer on the substrate to prepare the scintillator panel, (2) a composite rigid plate preparation step of bonding a flexible polymer film onto the rigid plate with an adhesive to prepare a composite rigid plate, (3) a preparation step of a scintillator panel provided with a composite rigid plate of opposing a surface of the composite rigid plate opposite the flexible polymer film to a surface of the scintillator panel opposite the scintillator layer on the substrate, and bonding the composite rigid plate to the scintillator panel to prepare the scintillator panel provided with a composite rigid plate, and (4) a preparation step of a radiation image detection member of opposing a surface of the photoelectric conversion base plate provided thereon with the photoelectric conversion elements to a surface of a side of the scintillator layer of the scintillator panel provided with a composite rigid plate, and bonding the photoelectric conversion base plate to the scintillator panel provided with a composite rigid plate to prepare a radiation image detection member.

2. The production method of a radiation image detector, as described in the foregoing 1, wherein, in the preparation step of a scintillator panel provided with a composite rigid plate, the said process of bonding the composite rigid plate to the scintillator panel to prepare the scintillator panel provided with the composite rigid plate is a process of bonding the composite rigid plate to the scintillator panel through an adhesive to prepare the scintillator panel provided with a composite rigid plate.

3. The production method of a radiation image detector, as described in the foregoing 1 or 2, wherein the adhesive used in the step of preparing the composite rigid plate is a hot-melt adhesive.

4. The production method of a radiation image detector, as described in any of the foregoing 1 to 3, wherein the preparation step of a scintillator panel provided with a composite rigid plate further comprises a heating step.

5. The production method of a radiation image detector, as described in any of the foregoing 1 to 4, wherein the composite rigid plate preparation step is conducted simultaneously with the preparation step of a scintillator panel provided with a composite rigid plate.

6. The production method of a radiation image detector, as described in any of the foregoing 1 to 5, wherein, in the preparation step of a radiation image detection member, bonding of the photoelectric conversion base plate to the scintillator plate provided with the photoelectric conversion elements is conducted under a reduced pressure.

7. A radiation image detector, wherein the radiation image detector is one which is produced by a production method of a radiation image detector, as described in any of the foregoing 1 to 6.

8. A radiation image detector comprising a scintillator panel which is provided with a scintillator layer on a substrate, a rigid plate which is disposed on a side of the substrate of the scintillator panel and a photoelectric conversion base plate which is disposed on a side of the scintillator layer of the scintillator panel and provided with plural photoelectric conversion elements on a one side of a base board, wherein a flexible polymer film is provided on the side opposite the scintillator panel side of the rigid plate.

Effect of the Invention

According the foregoing means of the invention, there are provided a production method of a radiation image detector which can be simply produced and is lessened in proportion of deformation (warpage) of an apparatus and is superior in image uniformity, and a radiation image detector obtained thereby.

PREFERRED EMBODIMENTS OF THE INVENTION

The present invention is directed to the production method of a radiation image detector comprising a scintillator panel which is provided with a scintillator layer on a substrate, a rigid plate which is disposed on a side of the substrate of the scintillator panel and a photoelectric conversion base plate which is disposed on a side of the scintillator layer of the scintillator panel and provided with plural photoelectric conversion elements on a one side of a base board, and the method comprising (1) a scintillator panel preparation step of forming a scintillator layer on the substrate to prepare the scintillator panel, (2) a composite rigid plate preparation step of bonding a flexible polymer film onto the rigid plate with an adhesive to prepare a composite rigid plate, (3) a preparation step of a scintillator panel provided with a composite rigid plate of opposing a surface of the composite rigid plate opposite the flexible polymer film to a surface of the scintillator panel opposite the scintillator layer on the substrate, and bonding the composite rigid plate to the scintillator panel to prepare the scintillator panel provided with a composite rigid plate, and (4) a preparation step of a radiation image detection member of opposing a surface of the photoelectric conversion base plate in which the photoelectric conversion elements are disposed to a surface of a side of the scintillator layer of the scintillator panel provided with a composite rigid plate, and bonding the photoelectric conversion base plate to the scintillator plate provided with the photoelectric conversion elements to prepare the radiation image detection member.

In the present invention, a rigid plate provided with a flexible polymer film is used for the scintillator panel, rendering it feasible to provide a production method of a radiation image detector which is superior in image uniformity.

Figure 1:
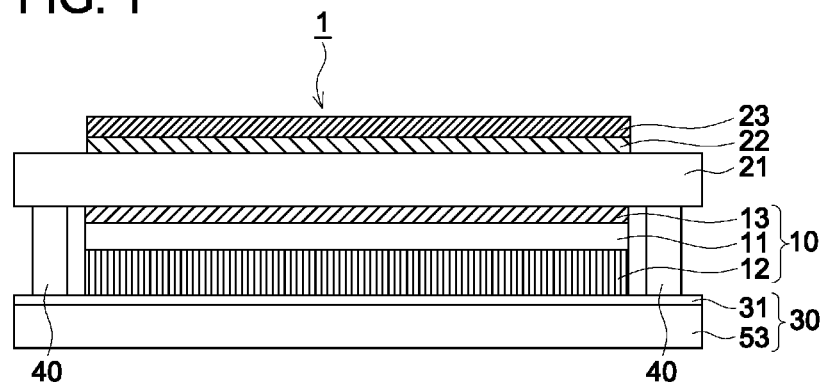
FIG. 1 shows a schematic sectional view of an example of a radiation image detector of the invention.

Constitution of Radiation Image Detector:

FIG. 1 shows a schematic sectional view of an example of a radiation image detector of the present invention.

A radiation image detector 1 comprises a scintillator panel 10, a rigid plate 21 and a photoelectric conversion base plate 30.

The scintillator panel 10 is provided with a scintillator layer 12 on a substrate 11.

The photoelectric conversion base plate 30 is provided with photoelectric conversion elements 31 on a base board 53. Plural photoelectric elements 31 are arranged two-dimensionally on the base board 53.

The rigid plate 21 comprises a flexible polymer film 23 through an adhesive layer A (22) formed with an adhesive.

The rigid plate 21 is adhered to the substrate 11 of the scintillator plate 10 through an adhesive layer B (13).

The rigid plate 21 is adhered to the photoelectric conversion base plate 30 through an adhesive layer C (40) at a portion in which the scintillator panel 10 does not exist.

Production Method of Radiation Image Detector:

The production method of the present invention comprises the foregoing steps of (1) to (4).

(1) Production Steps of Scintillator Panel:

In the steps of producing a scintillator panel, a scintillator layer is formed on the substrate to prepare a scintillator panel.

Constitution of Scintillator Panel:

The scintillator panel related to the present invention comprises a scintillator layer on the substrate, and preferably, a sublayer is provided between the substrate and the scintillator layer. A reflection layer may be provided on the substrate and there may also be constituted of a reflection layer, a sublayer and a phosphor layer.

There will be described below the individual constituent layers and constituent elements.

Scintillator Layer:

A scintillator layer related to the present invention contains a phosphor.

A variety of commonly known phosphor materials can be used for the material to form a scintillator layer but cesium iodide (CsI) is preferable which exhibits a relatively high conversion factor of X-rays to visible light and can easily form, by a process of vapor deposition, a columnar crystal structure of a phosphor, which is capable of inhibiting scattering of emitted light within a crystal through an optical guiding effect and increasing the thickness of the scintillator layer.

However, CsI alone results in reduced emission efficiency, so that various activators are added thereto. For example, CsI is mixed with sodium iodide (NaI) at an appropriate ratio, as disclosed in JP 54-035060 B. It is preferred that an activator material such as thallium (Tl), europium (Eu), indium (In), lithium (Li), potassium (K), rubidium (Rb) or sodium (Na) is included in CsI by the process of vapor deposition, as described in, for example, JP 2001-059899 A. Of these, an activator of sodium (Na), thallium (Tl) or europium (Eu) is preferable and thallium (Tl) is more preferable.

In the invention, it is preferred to use, as raw materials, cesium iodide and an additive containing at least one thallium compound and cesium iodide. Namely, thallium-activated cesium iodide (CsI:Tl), which exhibits a broad emission wavelengths of from 400 to 750 nm, is preferable.

Such an additive containing at least one thallium compound may use various thallium compounds (that is, a compound having oxidation number of +I or +III).

In the present invention, a preferable thallium compound is thallium iodide (TlI), thallium bromide (TlBr), thallium chloride (TlCl) or thallium fluoride (TlF, $TlF_3$).

The melting point of a thallium compound related to the present invention is preferably within the range of 400 to 700° C. In the present invention, the melting point refers to a melting point under ordinary pressure.

In the scintillator layer related to the present invention, the content of an additive, which is desirably optimized in accordance with its purpose or performance, is preferably from 0.001 to 50 mol % of the content of cesium iodide, and more preferably from 0.1 to 10.0 mol % in terms of emission luminance, property of cesium iodide and maintenance of function.

The thickness of a scintillator layer is preferably from 50 to 600 μm, and more preferably from 120 to 400 μm.

Reflection Layer:

In the present invention, it is preferred to provide a reflection layer on the substrate. Such a reflection layer reflects emitted light from a phosphor (scintillator), leading to enhanced light extraction efficiency. A reflection layer is formed preferably with a material containing at least an element selected from the group consisting of Al, Ag, Cr, Cu, Ni, Ti, Mg, Rh, Pt and Au. It is specifically preferred to use a thin metallic film composed of the foregoing elements, for example, Ag film or Al film. Such a thin film may be formed of two or more layers. The thickness of a reflection layer is preferably from 0.005 to 0.3 μm in terms of emission extraction efficiency, and more preferably from 0.01 to 0.2 μm.

Sublayer:

In the present invention, it is preferred to provide a sublayer between a substrate and a scintillator layer, or between a reflection layer and a scintillator layer. Such a sublayer may be formed by forming a layer with poly(p-xylylene) through a chemical vapor deposition method (CVD method), or a method using a polymeric binding material (binder), but the method using a polymeric binding material (binder) is preferred in terms of adhesion. The thickness of a sublayer is preferably from 0.5 to 4 μm in terms of sharpness and prevention of occurrence of disorder of columnar crystals.

A sublayer is formed preferably by coating a polymeric binder material (hereinafter, also denoted as binder) dissolved or dispersed in a solvent, followed by being dried. Specific examples of a polymeric binder include polyurethane, vinyl chloride copolymer, poly[(vinyl chloride)-co-(vinyl acetate)], poly[(vinyl chloride)-co-(vinylidene chloride)], poly[(vinyl chloride)-co-acrylonitrile], poly(butadiene-co-acrylonitrile), polyamide resin, poly(vinyl butyral), polyester, cellulose derivatives (e.g., nitrocellulose), poly(styrene-co-butadiene), various synthetic rubber resins, a phenol resin, epoxy resin, urea resin, melamine resin, phenoxy resin, silicone resin, acryl resin, and urea formaldehyde resin. Of these, a polyurethane resin, polyester resin, vinyl chloride copolymer, poly(vinyl butyral) and nitrocellulose are preferably used.

A polymeric binder such as polyurethane, polyester, vinyl chloride copolymer, poly(vinyl butyral) or nitrocellulose is also preferable in terms of adhesiveness to the phosphor layer. A polymer exhibiting a glass transition temperature (Tg) of 30 to 100° C. is also preferred in terms of adhesion between deposited crystals and a support. In view thereof; a polyester resin is specifically preferred.

Specific examples of a solvent used for preparation of a sublayer include a lower alcohol such as methanol, ethanol, n-propanol or n-butanol; a chlorine-containing hydrocarbon such as methylene chloride or ethylene chloride; a ketone such as acetone, methyl ethyl ketone, or methyl isobutyl ketone; an aromatic or alicyclic compound such as toluene, benzene, xylene, cyclohexane or cyclohexanone; an ester of a lower fatty acid and a lower alcohol such as methyl acetate, ethyl acetate, or butyl acetate; dioxane and an ether such as dioxane, ethylene glycol monomethyl ether or ethylene glycol monoethyl ether, and their mixture.

The sublayer may contain a pigment or dye to inhibit scattering of light emitted from a phosphor (scintillator) or to achieve an enhancement of sharpness or the like.

Substrate:

The substrate related to the present invention is a resin film composed of a resin. There are usable resin films (polymeric films or plastic films) such as cellulose acetate film, polyester film, polyethylene terephthalate (PET) film, polyethylene naphthalate (PEN) film, polyamide film, polyimide (PI) film, triacetate film, polycarbonate film and a carbon fiber reinforced resin sheet.

A resin film containing a polyimide or polyethylene naphthalate is specifically preferable when forming phosphor columnar crystals with a raw material of cesium iodide by a process of vapor phase deposition.

The thickness of a substrate is preferably from 100 μm to 1 mm, and more preferably from 300 to 500 μm.

Formation of Reflection Layer:

A metallic thin film (such as Al film or Ag film) as a reflection layer is formed on one surface of the substrate. When using a resin film as a substrate, films which are prepared by forming an aluminum film on such a resin film through sputtering deposition, are commercially available in the form of various kinds and also usable as a substrate.

Formation of Sublayer:

A polymeric binder is dispersed or dissolved in an organic solvent, coated and dried to form a sublayer. Such a polymeric binder preferably is a hydrophobic resin such as a polyester resin or polyurethane resin in terms of adhesiveness and corrosion resistance for a reflection layer.

Formation of Scintillator Layer:

A scintillator layer can be formed by a gas phase deposition method such as a vapor deposition method. In the following, there will be described a typical example of a vapor deposition method.

Figure 2:
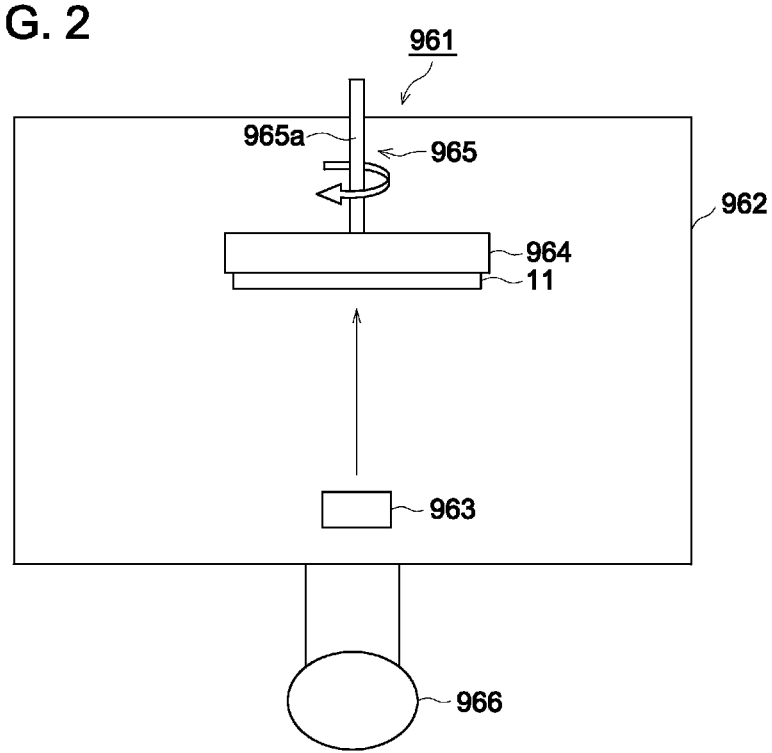
FIG. 2 shows a schematic sectional view of an example of an apparatus to form a scintillator layer.

Vapor Deposition Apparatus:

As shown in FIG. 2, a vapor deposition apparatus 961 is provided with a box type vacuum vessel 962 and a boat 963 for use in vacuum deposition is disposed within the vacuum vessel 962. The boat 963 is a member to house an evaporation source and electrodes are connected to the boat 963 so that, when an electric current is applied through the electrodes, the boat generates heat through the Joule heat phenomenon. In production of a radiation scintillator panel, the boat 963 is filled with a mixture including cesium iodide and an activator compound, and application of an electric current to the boat 963 causes the mixture to be heated and vaporized.

An aluminum crucible wound with a heater may be used as a housing member or there may be used a refractory metal heater.

A holder 964 to hold the substrate 11 is disposed within the evacuation vessel 962 and above the boat 963. The holder 964 is provided with a heater (not shown in the drawing) and operating the heater can heat the substrate 11 held by the holder. Heating the substrate 11 makes it feasible to separate or remove material adhered to the surface of the substrate 11, to inhibit formation of impurities between the substrate 11 and the phosphor layer, to strengthen adhesion of the substrate 11 onto the phosphor layer formed on the surface of the substrate or to control surface quality of the phosphor layer 2 formed on the substrate 11.

A rotation mechanism 965 to rotate the holder 964 is disposed in the holder 964. The rotation mechanism 965 is constituted of a rotation shaft 965*a* connected to the holder 964 and a motor (not shown in the drawing) as a driving source. Driving the motor rotates the rotation shaft 965*a* and thereby, the holder 964 can be rotated, while being opposed to the boat 963.

The vapor deposition apparatus 961 is provided with a vacuum pump 966 used for the vacuum vessel 962 in addition to the foregoing constitution. The vacuum pump 966 evacuates the interior of the vacuum vessel 962 to allow gas to be introduced into the interior of the vacuum vessel 962. Operating the vacuum pump 966 can maintain the interior of the vacuum vessel 962 with gaseous atmosphere at a prescribed pressure.

In the following, there will be described a case of using cesium iodide and thallium iodide.

As described above, the substrate 11 provided with a reflection layer and a sublayer is placed on the holder 964. Plural boats 963 (not shown in the drawing) are filled with a powdery mixture containing cesium iodide and thallium iodide (preliminary step). In that case, the distance between the boat 963 and the substrate 11 is set to a distance of 100 to 1500 mm and a vapor deposition step, as described later, is conducted while maintaining such a distance. The distance between the boat 963 and the substrate 11 is preferably not less than 400 mm and not more than 1500 mm, and plural boats are simultaneously heated to achieve vapor deposition.

After completing the preliminary step, the vacuum pump 966 is put into operation to evacuate the interior portion of the evacuation vessel 962 to form a vacuum atmosphere of not more than 0.1 Pa. Herein, the vacuum atmosphere preferably is an atmosphere under a pressure of not more than 100 Pa and preferably not more than 0.1 Pa.

Subsequently, an inert gas such as argon or the like is introduced into the interior portion of the vacuum vessel 962, and the interior portion of the vacuum vessel 962 is maintained at a vacuum atmosphere of 0.001 to 5 Pa, and preferably 0.01 to 2 Pa. Thereafter, a heater of the holder 964 and a motor of the rotation mechanism 965 are driven, whereby the substrate 11 fixed to the holder is rotated with heating, while being opposed to the boat 963. The temperature of the substrate 11 on which a phosphor layer is formed is controlled preferably between 25° C. (room temperature) and 50° C. at the time of initiating evaporation and is maintained preferably at a temperature of 100 to 300° C., and more preferably 150 to 250° C. during evaporation.

In such a state, an electric current is applied from an electrode to the boat 963 to heat a mixture containing cesium iodide and thallium iodide to a temperature of approximately 700° C. over a prescribed period of time to evaporate the mixture. Consequently, a number of columnar crystals are sequentially grown on the surface of the substrate 11 to obtain crystals with an intended thickness to prepare a scintillator panel having cesium iodide on the substrate.

(2) Composite Rigid Plate Preparation Step:

In the preparation step of a composite rigid plate, a flexible polymeric film is adhered to a rigid plate to prepare a composite rigid plate.

Rigid Plate:

The rigid plate related to the present invention refers to a planar body exhibiting an elastic modulus of not less than 10 GPa. Such a rigid plate includes, for example, a metal, glass, carbon or their composite materials.

The thickness of the rigid plate is preferably from 300 µm to 5000 µm, and more preferably from 300 µm to 1000 µm.

Flexible Polymer Film:

A flexible polymer film is one which is composed of a polymer compound and exhibits an elastic modulus at 120° C. (also denoted simply as E120) of 1000 to 6000 N/mm$^2$.

In the region showing a linear relationship between strain and corresponding stress which is measured by using a tensile strength tester based on JIS C 2318, the elastic modulus is calculated as the slope of the straight portion of the stress-strain curve, that is, strain divided by stress, which is also referred to as a Young's modulus. In the present invention, such a Young's modulus is defined as the elastic modulus.

Specific examples thereof include polymer films, such as polyethylene naphthalate (E120=4100 N/mm$^2$), polyethylene terephthalate (E120=1500 N/mm$^2$), polybutylene naphthalate (E120=1600 N/mm$^2$), polycarbonate (E120=1700 N/mm$^2$), syndiotactic polystyrene (E120=2200 N/mm$^2$), polyether imide (E120=1900 N/mm$^2$), polyimide (E120=1200 N/mm$^2$), polyarylate (E120=1700 N/mm$^2$), polysulfone (E120=1800 N/mm$^2$) and polyether sulfone (E120=1700 N/mm$^2$).

These may be used singly or mixedly, or laminated. Of these polymer films, a polymer film comprising polyimide or polyethylene naphthalate is preferred.

The flexible film preferably exhibits a thermal expansion coefficient which is equivalent to that of the scintillator panel. The expression, "being equivalent" represents the following relationship being satisfied:

$$0.8 \times \epsilon_b \leq \epsilon_a \leq 1.2 \times \epsilon_b$$

wherein $\epsilon_a$ represents the thermal expansion coefficient of the flexible film and $\epsilon_b$ represents the thermal expansion coefficient of the scintillator panel.

The flexible film preferably is one which exhibits a high ultraviolet transmittance. The expression, "high ultraviolet transmittance" means a transmittance of not less than 30% at a wavelength region of not more than 360 nm.

Adhesive:

An adhesive used in the step of preparing the composite rigid plate may be any one capable of bonding a polymeric film to the rigid plate, and an adhesive mainly composed of a thermoplastic resin is preferably used.

The thickness of an adhesive layer A formed with an adhesive is preferably not less than 1 µm and not more than 100 µm in terms of adhesion strength and prevention of unevenness of image quality, and more preferably, not less than 10 µm and not more than 60 µm.

An adhesive preferably employs a hot-melt adhesive, as described below.

A hot-melt sheet refers to a hot-melt adhesive which is formed in a sheet form. Such a hot-melt adhesive is one which is composed mainly of a thermoplastic resin, being a solid at an ordinary temperature and is liquidized on heat fusion. Adhesion members are adhered with a liquidized hot-melt adhesive and cooled to solidify the hot-melt adhesive, forming adhesion.

Preparation of Composite Rigid Plate:

A rigid plate (composite rigid plate) onto which a flexible polymer film is adhered is obtained by placing the foregoing adhesive between the flexible polymer film and the rigid plate and applying bonding pressure thereto. In one preferred embodiment, it is preferred to conduct heating during compression bonding.

There will be described the preferred embodiment of a method of using a hot-melt sheet as an adhesive.

A hot-melt sheet is sandwiched between the flexible polymer film and a rigid plate, pressure is applied thereto, followed by heat-melting, whereby the flexible polymer film is adhered onto the rigid plate.

A hot-melt sheet does not exhibit an adhesion strength at ordinary temperature, so that, when adhering a flexible polymer film to a rigid plate, alignment is very easy, compared to a cold setting adhesive. Namely, after alignment is conducted at the state not giving rise to adhesion strength, heat-melting results in adhesion strength to complete adhesion and accordingly, alignment between the flexible film and the rigid plate can be conducted easily and accurately.

Such a hot-melt sheet can employ commonly known ones. Types of a hot-melt sheet include, for example, an polyolefin type, polyamide type, polyester type, polyurethane type and EVA type, in accordance with the main component, but are not limited to these.

The pressure applied during adhesion of a hot-melt sheet is preferably from 0.001 MPa to 10 MPa, and more preferably, 0.01 MPa to 1 MPa. Application of pressure of not less than 0.001 MPa renders it feasible to perform uniform adhesion without giving rise to air pockets. On the other hand, application of a pressure of not more than 10 MPa inhibits damage of a phosphor, leading to reduced concern of adverse effects of image quality.

The heat-treatment temperature, which depends on the kind of hot-melt sheet, is preferably within the range of 70 to 200° C., and more preferably 90 to 160° C.

(3) Preparation Step of Scintillator Panel Provided with Composite Rigid Plate:

In the preparation step of a scintillator panel provided with a composite rigid plate, the surface of the composite rigid plate opposite to the flexible polymer film is opposed to the surface of the scintillator panel opposite the scintillator layer on the substrate, and the composite rigid plate is bonded to the scintillator panel to prepare the scintillator panel provided with a composite rigid plate.

It is preferred that the adhesive is allowed to intervene between the composite rigid plate and the scintillator panel to adhere the composite plate to the scintillator plate, in which adhesives, as described above are preferably used as the adhesive. A method comprising a heating step is preferred, in which it is specifically preferred to use a hot-melt sheet.

In the present invention, a composite rigid plate may be adhered to a scintillator panel after preparation of the composite rigid plate, but it is specifically preferred in terms of inhibition of image unevenness and productivity that preparation of a composite rigid plate and adhesion to a scintillator panel are simultaneously conducted.

Namely, hot-melt sheets are placed on both surfaces of a rigid plate, then, the foregoing flexible polymer sheet is placed on one surface of the polymer sheet and a scintillator panel is disposed on the other surface of the polymer sheet, and thereafter, heating is performed to prepare a scintillator panel provided with a composite rigid plate.

A hot-melt sheet is usable under the conditions, as described above.

(4) Preparation Step of Radiation Image Detection Member:

In the preparation step of a radiation image detection member, the surface of the photoelectric conversion base plate in which photoelectric conversion elements are disposed is opposed to a surface of a side of the scintillator layer of the scintillator panel provided with a composite rigid plate, and the photoelectric conversion base plate is bonded to the scintillator panel provided with a rigid plate to prepare a radiation image detection member.

To bond a photoelectric conversion base plate to a scintillator panel provided with a composite rigid plate, the foregoing scintillator layer is opposed to the photoelectric conversion device to be bonded.

Specifically, a rigid plate is provided with a portion in which a scintillator panel does not exist (i.e., at the periphery of the scintillator panel) and, as shown in FIG. 1, a scintillator panel (10) provided with a rigid plate is placed on a photoelectric conversion base plate (30) so that the scintillator layer opposes the photoelectric elements to achieve bonding through a adhesive layer C (40) formed with an adhesive (C).

A photo-curing adhesive which is curable upon exposure to light such as ultraviolet rays or a thermo-setting adhesive which is curable upon heating is preferably used for the adhesive (C).

In the present invention, the space formed by the adhesive layer C and the scintillator panel are preferably under reduced pressure to achieve bonding, as described above.

Figure 3A:
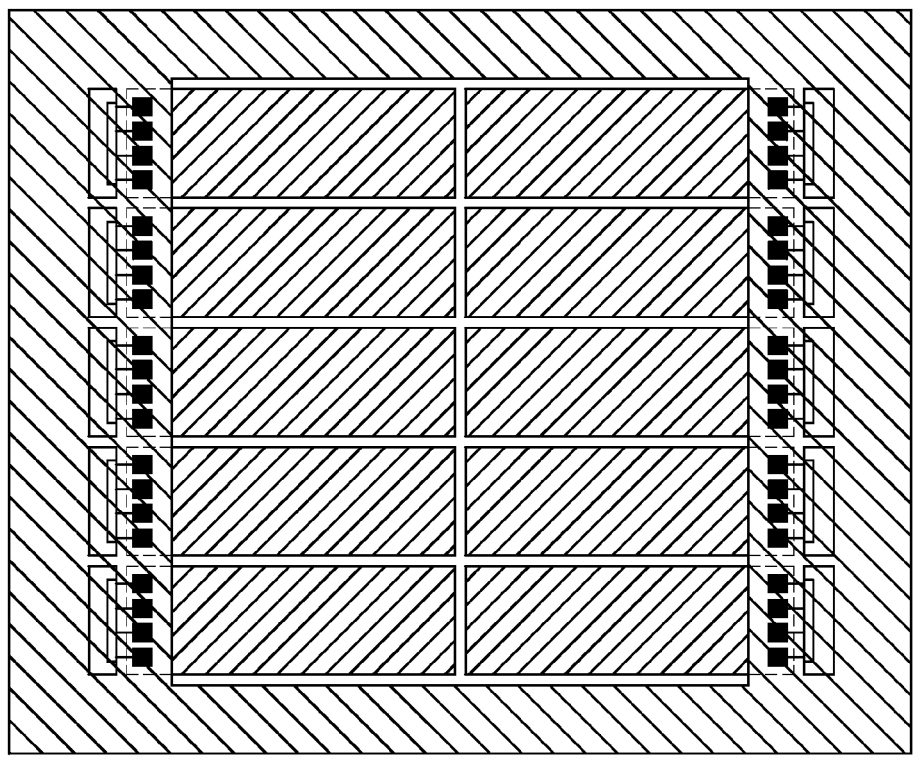
FIGS. 3a and 3b show a planar view and a sectional view of an example of a photoelectric conversion substrate.
Figure 3B:
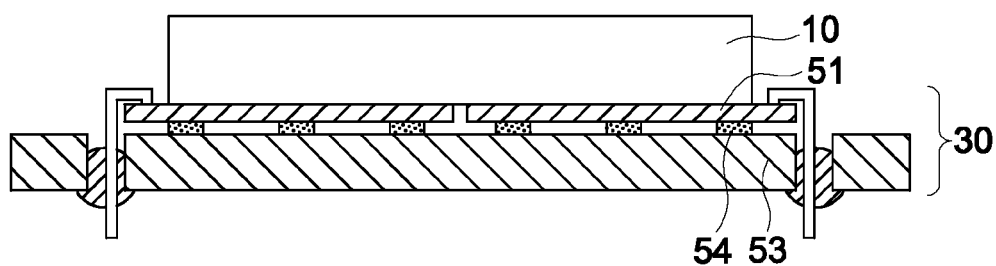

Photoelectric Conversion Base Plate:

There will be described a photoelectric conversion base plate related to the present invention with reference to FIGS. 3a and 3b. FIGS. 3a and 3b show a configuration diagram of a photoelectric conversion base plate of a radiation image detector. FIG. 3a shows a top view of the apparatus and FIG. 3b shows a sectional view thereof. As shown in FIG. 3b, a photoelectric conversion element section (51) in which photoelectric elements are formed is adhered onto the base board (53) through an adhesive layer D (54). This is referred to as a photoelectric conversion base plate (30).

Photoelectric conversion elements formed in the photoelectric conversion element section (51), which are typified by a CCD, CMOS, or A-Si photodiode (PIN type, MIS type), are two-dimensionally disposed in the photoelectric conversion element section (51).

The photoelectric conversion element section (51) is bonded with plural sheets (ten sheets in FIG. 3a), which are regularly disposed two-dimensionally.

The base board (53) employs materials such as glass, ceramic, CFRP or aluminum, and taking into account heat applied in the process of production, it is desirable to select materials used for the scintillator panel (10), the photoelectric conversion element section (51) and the base board (53) which are as close as possible in thermal expansion coefficient.

EXAMPLES

In the following, the present invention will be described with reference to examples but the present invention is by no means limited to these.

Example 1

Preparation of Radiation Image Detector 1

Preparation of Scintillator Panel:
Formation of Reflection Layer:

A 20 nm thick nickel-chromium alloy layer, as a first metal layer, was formed on one surface of a 125 μm thick polyimide substrate through a sputtering method. Subsequently, a 100 nm thick silver layer, as a second metal layer, was formed through a sputter deposition method.

Formation of Protective Layer:

| | |
|---|---|
| Vylon 630 (polyester resin, produced by Toyobo Co., Ltd.) | 100 parts by mass |
| Methyl ethyl ketone (MEK) | 90 parts by mass |
| Toluene | 90 parts by mass |

The foregoing composition was mixed and dispersed by a ball mill over 15 hours to obtain a coating solution. The thus obtained coating solution was coated on the sputtered surface of the foregoing polyimide substrate by a bar coater so that the dry thickness was 1.0 μm, and then dried at 100° C. over 8 hours.

Preparation of Vapor Deposition Substrate:

The substrate provided with a protective layer was fitted into a metal frame and set into a holder of a vapor deposition apparatus, as shown in FIG. 2.

Formation of Scintillator Layer (Phosphor Layer):

A parent material (CsI containing no activator) and an activator (TlI) were deposited on the protective layer side of the substrate in the manner described below by using a vapor deposition apparatus shown in FIG. 2.

First, a parent material (CsI containing no activator) and an activator (TlI) were placed into a resistance heating crucible, the substrate was fitted to a metal frame on a rotary holder and the distance between the substrate and an evaporation source was controlled to 400 mm.

Subsequently, after evacuating the interior of the evaporation apparatus, Ar gas was introduced thereto to control the degree of vacuum to 0.5 Pa and the substrate was rotated at a rate of 6 rpm. The substrate was heated simultaneously with the resistance heating crucible and after the temperature of the substrate reached 200° C., the substrate was maintained at 200° C. After completing evaporation, the substrate was removed from the holder, whereby a plate provided with a scintillator layer was obtained. The thus obtained plate was cut to 300 mm by a cutter.

Preparation of Composite Rigid Plate:

Using a polyethylene terephthalate film (thickness: 0.125 mm) as a flexible polymer film, a glass plate (thickness: 0.5 mm) as a rigid plate and a hot-melt sheet NP 608 (produced by Sony Chemical Co.) as an adhesive, the adhesive of the same size as the flexible polymer film was inserted between the flexible polymer film and the rigid plate. Thereafter, the pressure was reduced to 100 kPa and subsequently, heating was conducted at 100° C. over 10 minutes, whereby the rigid plate was adhered onto the flexible film to prepare a composite rigid plate with a 0.05 mm thick adhesive layer.

Preparation of Scintillator Panel Provided with Composite Rigid Plate:

Subsequently, a hot-melt sheet NP 608 (which was the same as described above) was inserted between the scintillator layer side of the foregoing scintillator panel and the opposite side of the composite rigid plate to the flexible polymer film. Thereafter, the pressure was reduced to 100 kPa and subsequently, heating was conducted at 100° C. over 10 minutes to perform thermal fusion, whereby the scintillator layer was adhered to the rigid plate to prepare a scintillator panel provided with the composite rigid plate.

Preparation of Radiation Image Detector Member:

The thus obtained scintillator panel provided with the composite rigid plate was adhered to a photoelectric conversion base plate to prepare a radiation image detector member, as below.

First of all, a photoelectric conversion base plate provided with TFT was placed on a base board of 350 mm×350 mm. Subsequently, onto the surface to which a scintillator layer of 300 mm×300 mm was adhered, a photo-curable adhesive (NOA 68, produced by Noland Co.) was coated at a thickness of 0.5 mm at the position of 5 mm from the edge portion to adhere the photoelectric conversion base plate. The thus adhered panel was placed into a vacuum desiccator and exposed to a metal halide lamp (produced by OAK Co.) at 6 kW and 9000 J, while reducing the pressure within the desiccator. The internal pressure of the desiccator was controlled to 1000 Pa and maintained at 1000 Pa over 1 minute and then returned to atmospheric pressure, whereby a radiation image detector member was obtained. The thus obtained radiation image detector member was placed into a housing to obtain a radiation image detector 1.

Example 2

Preparation of Radiation Image Detector 2

Preparation of Scintillator Panel:

A scintillator panel was prepared in the same manner as in Example 1.

Preparation of Composite Rigid Plate and Preparation of Scintillator Panel Provided with Composite Rigid Plate:

Preparation of a composite rigid plate and preparation of a scintillator plate provided with a composite rigid plate were simultaneously conducted in the manner, as described below.

A scintillator panel was cut to a size of 350 mm, which was adhered to a rigid plate. At that time, a hot-melt sheet (M 1083, produced by Lihit-Lab. Co., Ltd.) was placed onto the opposite side of the scintillator layer. Further thereon, a rigid plate (glass), a hot-melt sheet (M 1083, produced by Lihit-Lab. Co., Ltd.), and a flexible film (0.125 mm thick polyethylene terephthalate) were laminated in that order.

Subsequently, the pressure was reduced to 100 kPa and then, thermal fusion was conducted at 100° C. over 10 minutes, whereby the scintillator layer, the rigid plate and the flexible film were adhered through the hot-melt sheet to obtain a scintillator panel provided with a composite rigid plate.

Preparation of Radiation Image Detector Member:

The thus obtained scintillator panel provided with a composite rigid plate was adhered to a photoelectric conversion base plate to prepare a radiation image detector member.

Initially, a photoelectric conversion base plate provided with TFT was placed on a base board of 350 mm×350 mm. Subsequently, onto the surface to which a scintillator layer of 300 mm×300 mm was adhered, an adhesive (UV-curable epoxy adhesive) was coated at a thickness of 0.5 mm at the position of 5 mm from the edge portion of the scintillator to adhere the photoelectric conversion base plate. The thus adhered panel was placed into a vacuum desiccator and exposed to a metal halide lamp (produced by OAK Co.) at 6 kW and 9000 J, while reducing the pressure within the desiccator. The internal pressure of the desiccator was controlled to 1000 Pa and maintained at 1000 Pa over 1 minute, and then returned to atmospheric pressure, whereby a radiation image detector member was obtained. The thus obtained radiation image detector member was placed into a housing to obtain a radiation image detector 2.

Comparison Example 1

Preparation of Radiation Image Detector 3

A radiation image detector 3 was prepared in the same manner as the radiation image detector 1 in Example 1, except that the step of adhesion of a flexible polymer film was not included.

Evaluation

Image Uniformity:

Warpage extent and luminance unevenness, as a measure of image uniformity, were determined in the manner described below.

Evaluation of Warpage:

When each of the thus obtained radiation image detectors was placed on a flat board, the floating extent at the edge portion was measured by using a clearance gage. A floating extent at the edge portion of not more than 0.5 mm is within the range acceptable in practice.

Evaluation of Luminance Unevenness:

The radiation incident side of the thus prepared radiation image detector was exposed to X-rays of 1.0 mR at a tube voltage of 70 kVp and digital signals indicating emission of a scintillator were digitally recorded on a hard disc to obtain an image.

In an area of 5 mm×5 mm of the thus obtained image, as described above, luminance was measured at 25 points in areas which were divided at regular intervals of 1 mm and an average value thereof was determined. Further, the difference in luminance between maximum and minimum values was calculated and the difference divided by the average value was defined as the luminance unevenness value. If this value is less, then luminance unevenness is less. A value of approximately not more than 1.5 is within the range which is acceptable in practical use.

The foregoing evaluation results are shown in Table 1

TABLE 1

| Radiation Image Detector | Presence of Flexible Film | Warpage y | Luminance Unevenness | Remark |
|---|---|---|---|---|
| 1 | Yes | not more than 0.3 mm | 1.0 | Invention |
| 2 | Yes | not more than 0.3 mm | 1.0 | Invention*[1] |
| 3 | No | 1.0 mm | 6.0 | Comparison |

*[1]: Steps (2) and (3) of the invention were simultaneously conducted.

As is apparent from the results shown in Table 1, it was proved that a radiation image detector which was superior in image uniformity was obtained by the production method of the invention by a simple manner of thermal adhesion.

EXPLANATION OF NUMERALS

1: Radiation image detector
10: Scintillator panel
11: Substrate
12: Scintillator layer
13: Adhesive layer B
21: Rigid plate
22: Adhesive layer A
23: Flexible polymer film
30: Photoelectric conversion base plate
40: Adhesive layer C
51: Photoelectric conversion element section
53: Base board
54: Adhesive layer D
961: Vapor deposition apparatus
962: Vacuum vessel
963: Boat
964: Holder
965: Rotation mechanism
966: Evacuation pump

What is claimed is:

1. A radiation image detector comprising:
a scintillator panel which is provided with a scintillator layer on a substrate,
a rigid plate which is disposed on a side of the substrate of the scintillator panel, and
a photoelectric conversion base plate which is disposed on a side of the scintillator layer of the scintillator panel and provided with plural photoelectric conversion elements on a one side of a base board,
wherein a flexible polymer film is provided on a side opposite a scintillator panel side of the rigid plate, and
the scintillator layer comprises a phosphor having a columnar structure prepared by vapor deposition.

2. A radiation image detector comprising:
a scintillator panel provided with a scintillator layer on a substrate;
a composite rigid plate having a rigid plate and a flexible polymer film adhered to the rigid plate, the composite rigid plate having the rigid plate bond to the substrate of the scintillator panel, the rigid plate made of a metal, a glass, a carbon or a composite material thereof; and
a photoelectric conversion base plate disposed on the scintillator layer of the scintillator panel and bonded to the scintillator panel, the photoelectric conversion base plate having a plural photoelectric conversion elements disposed on a one side of a base board; and the detector made by the following method;
(1) a scintillator panel preparation step of forming the scintillator layer on the substrate to prepare the scintillator panel;
(2) a composite rigid plate preparation step of bonding the flexible polymer film to the rigid plate with an adhesive to prepare a composite rigid plate;
(3) a preparation step of a scintillator panel provided with a composite rigid plate of opposing a surface of the composite rigid plate, opposite the flexible polymer film, to a surface of the scintillator panel, opposite the scintillator layer, and bonding the composite rigid plate to the scintillator panel to prepare the scintillator panel provided with a composite rigid plate, and
(4) a preparation step of a radiation image detection member of opposing a surface of the photoelectric conversion base plate on which the photoelectric conversion elements are disposed, to a surface of the scintillator layer of the scintillator panel provided with a composite rigid plate, and bonding the photoelectric conversion base plate to the scintillator panel provided with a composite rigid plate to make the radiation detector.

3. A production method of a radiation image detector, the detector comprising a scintillator panel provided with a scintillator layer on a substrate, a rigid plate disposed on a side of the substrate of the scintillator panel, and a photoelectric conversion base plate disposed on the scintillator layer of the scintillator panel, the photoelectric conversion base plate having a plural photoelectric conversion elements disposed on one side of a base board, the method comprising:
(1) a scintillator panel preparation step of forming the scintillator layer on the substrate to prepare the scintillator panel;
(2) a composite rigid plate preparation step of bonding a flexible polymer film to the rigid plate with an adhesive to prepare a composite rigid plate, wherein the rigid plate is made of a metal, a glass, a carbon or a composite material thereof;
(3) a preparation step of a scintillator panel provided with a composite rigid plate of opposing a surface of the composite rigid plate, opposite the flexible polymer film, to a surface of the scintillator panel, opposite the scintillator layer, and bonding the composite rigid plate to the scintillator panel to prepare the scintillator panel provided with a composite rigid plate; and (4) a preparation step of a radiation image detection member of opposing a surface of the photoelectric conversion base plate, on which the photoelectric conversion elements are disposed, to a surface of the scintillator layer of the scintillator panel provided with composite rigid plate, and bonding the photoelectric conversion base plate to the scintillator panel provided with a composite rigid plate to produce a radiation image detector.

4. The production method of a radiation image detector, as claimed in claim 1, wherein, in the preparation step of a scintillator panel provided with a composite rigid plate, said bonding the composite rigid plate to the scintillator panel to prepare the scintillator panel provided with the composite rigid plate is bonding the composite rigid plate to the scintillator panel through an adhesive to prepare the scintillator panel provided with a composite rigid plate.

5. The production method of a radiation image detector, as claimed in claim 1, wherein the adhesive used in the step of preparing the composite rigid plate is a hot-melt adhesive.

6. The production method of a radiation image detector, as claimed in claim 1, wherein the preparation step of a scintillator panel provided with a composite rigid plate comprises a heating step.

7. The production method of a radiation image detector, as claimed in claim 1, wherein the composite rigid plate preparation step and the preparation step of a scintillator panel provided with a composite rigid plate are simultaneously conducted.

8. The production method of a radiation image detector, as claimed in claim 1, wherein, in the preparation step of a radiation image detection member, bonding of the photoelectric conversion base plate to the scintillator plate provided with the photoelectric conversion elements is conducted under a reduced pressure.

9. The production method of a radiation image detector, as claimed in claim 1, wherein the rigid plate is made of glass.

* * * * *